United States Patent
Thapa et al.

(10) Patent No.: US 12,386,673 B2
(45) Date of Patent: *Aug. 12, 2025

(54) HARDWARE-BASED PREDICTIVE FAULT DETECTION AND ANALYSIS

(71) Applicant: Hewlett Packard Enterprise Development LP, Spring, TX (US)

(72) Inventors: Suresh K. Thapa, Austin, TX (US); Garnett H. Thompson, Austin, TX (US); Abhishek C. Mehta, Seattle, WA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/581,777

(22) Filed: Feb. 20, 2024

(65) Prior Publication Data

US 2024/0192999 A1    Jun. 13, 2024

Related U.S. Application Data

(63) Continuation of application No. 17/174,284, filed on Feb. 11, 2021, now Pat. No. 11,983,571.

(51) Int. Cl.
*G06F 9/50* (2006.01)
*G06F 9/38* (2018.01)
*G06F 30/331* (2020.01)

(52) U.S. Cl.
CPC ............ *G06F 9/505* (2013.01); *G06F 9/3877* (2013.01); *G06F 9/3891* (2013.01); *G06F 9/5038* (2013.01); *G06F 30/331* (2020.01)

(58) Field of Classification Search
CPC ...... G06F 9/505; G06F 9/3877; G06F 9/3891; G06F 9/5038; G06F 30/331
See application file for complete search history.

(56) References Cited

U.S. PATENT DOCUMENTS

| | | | |
|---|---|---|---|
| 6,757,748 B1 | 6/2004 | Hipp | |
| 9,557,792 B1 | 1/2017 | Potlapally et al. | |
| 11,424,976 B1 | 8/2022 | Adamo et al. | |
| 2003/0097610 A1 | 5/2003 | Hofner | |
| 2005/0114739 A1 | 5/2005 | Gupta et al. | |
| 2010/0333089 A1 | 12/2010 | Talwar et al. | |
| 2011/0254526 A1 | 10/2011 | Luo et al. | |
| 2015/0048950 A1 | 2/2015 | Zeighami et al. | |
| 2017/0235622 A1 | 8/2017 | Boyapalle et al. | |
| 2018/0255095 A1 | 9/2018 | Doron et al. | |
| 2019/0158367 A1 | 5/2019 | Barooah | |
| 2019/0213504 A1 | 7/2019 | Vasseur et al. | |
| 2020/0296856 A1 | 9/2020 | Byers et al. | |
| 2021/0236931 A1* | 8/2021 | Cox | A63F 13/5375 |

* cited by examiner

*Primary Examiner* — Jorge A Chu Joy-Davila
(74) *Attorney, Agent, or Firm* — Slater Matsil, LLP

(57) ABSTRACT

A method and system for hardware-based predictive fault detection and analysis are described herein. Logic components of a computing cluster can baseline a plurality of telemetries associated with at least one processing node of the computing cluster. The logic components can monitor the plurality of telemetries while the at least one processing node is in operation. The logic components of the computing cluster can compare the monitored plurality of telemetries with the baselined plurality of telemetries. The logic components can predict one or more impending faults associated with the at least one processing node based on the comparisons.

20 Claims, 6 Drawing Sheets

HARDWARE-BASED PREDICTIVE FAULT DETECTION AND ANALYSIS

CROSS-REFERENCE TO RELATED APPLICATIONS

This application is a continuation application of and claims priority to application Ser. No. 17/174,284, filed on Feb. 11, 2021, the contents of which are hereby incorporated by reference in their entireties.

DESCRIPTION OF RELATED ART

A computing system can comprise a plurality of computing clusters. Computing tasks associated with the computing system can be distributed to the plurality of computing clusters. The plurality of computing clusters can be configured to perform the distributed computing tasks.

BRIEF DESCRIPTION OF THE DRAWINGS

The present disclosure, in accordance with one or more various embodiments, is described in detail with reference to the following figures. The figures are provided for purposes of illustration only and merely depict typical or exemplary embodiments.

Figure 1:
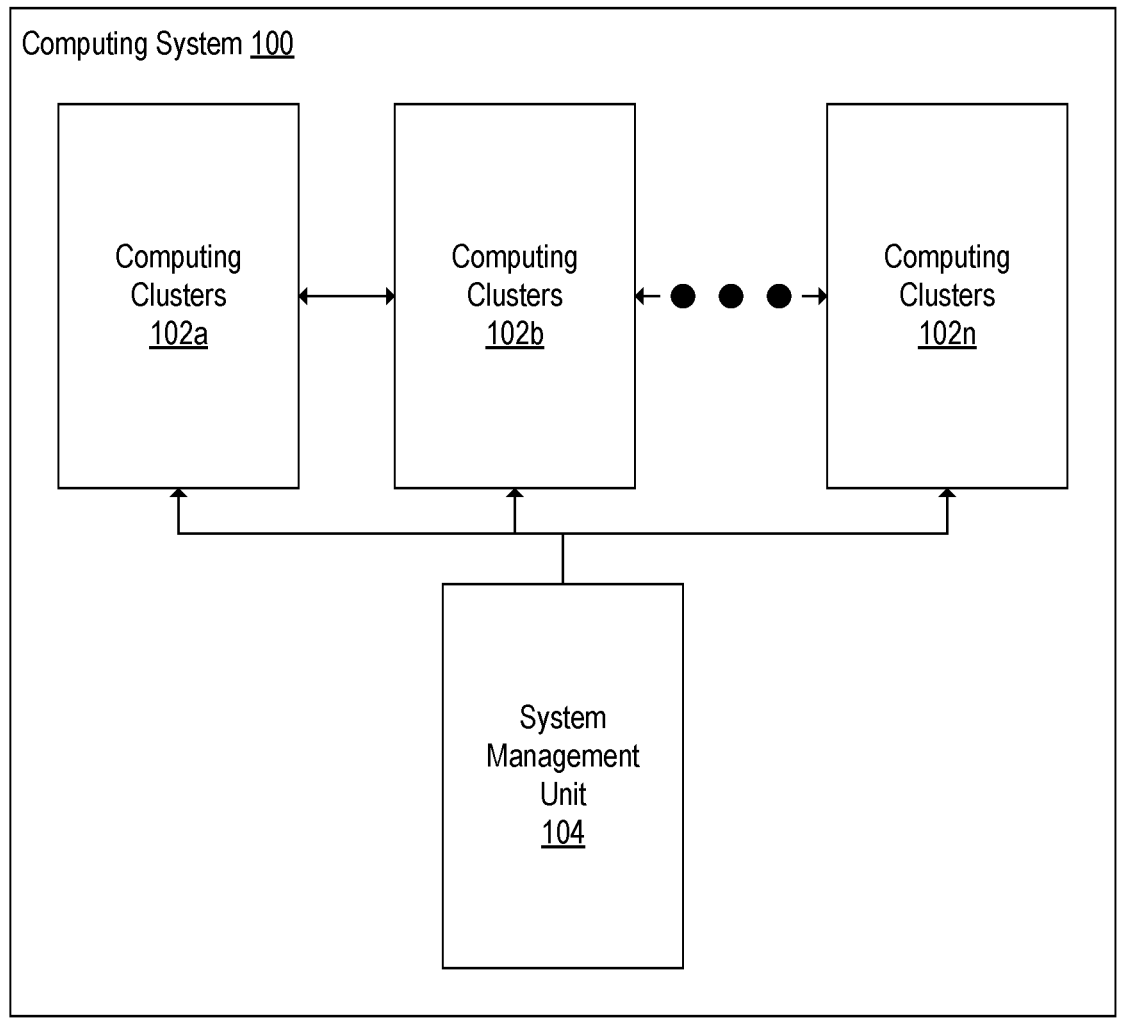
FIG. 1 illustrates an example computing system in accordance with various embodiments of the present disclosure.

The figures are not exhaustive and do not limit the present disclosure to the precise form disclosed.

DETAILED DESCRIPTION

A computing system can comprise a plurality of computing clusters. The plurality of computing clusters can be communicatively coupled to perform various complex computing tasks. For example, a plurality of computing clusters can be networked as a supercomputer to perform climate modeling, particle physics modeling, protein structure modeling, nuclear decay modeling, or other scientific modeling. In some cases, the plurality of computing clusters can be networked to perform big data analysis, machine learning, computer vision, object recognition, etc. Electronics or other hardware components associated with the plurality of computing clusters may fail over time due to various usage, latent defects, and/or environmental factors. For example, a prolonged utilization of a processor at high clock speeds may cause the processor to prematurely fail. As another example, a non-volatile memory may include a latent defect that causes the non-volatile memory to prematurely fail after a certain number of read/write cycles before reaching mean time before failure (MTBF) of the non-volatile memory. These failures, sometimes, can be abrupt or unanticipated and may cause unintended downtimes. In some cases, these failures can be catastrophic. For example, a voltage regulator regulating an input voltage to a central processor unit (CPU) of a computing cluster may fail abruptly without any indication or sign. In this example, the failure of the voltage regulator may cause the CPU to malfunction and cause interruptions to CPU write instructions to memory components associated with the CPU, which may result in data loss. Under conventional approaches, software can be deployed to monitor various telemetries associated with computing clusters and to identify potential faults or failures of the computing clusters based on the telemetries. However, such conventional approaches of using software to identify faults or failures are not ideal because of various latencies associated with software.

Described herein are solutions that address the problems described above. The claimed invention provides a hardware-based, instead of a software-based, predictive fault detection and analysis scheme for a computing system. Unlike a software-based scheme, a hardware-based fault detection and analysis scheme can operate at or near real-time, does not take away processor resources, and can be implemented using minimal logical resources (e.g., look up tables) of existing field-programmable gate arrays (FPGAs). Various embodiments of the present disclosure can include a computing system. The computing system can comprise a plurality of computing clusters. The plurality of computing clusters can be communicatively coupled over a high-speed data bus or network to perform or execute various computing tasks. Each computing cluster of the plurality of computing cluster can include a cluster management module and a plurality of node processing modules. In some embodiments, the cluster management module can distribute computing tasks assigned to each computing cluster to the plurality of node processing modules of each computing cluster for processing. For example, the cluster management module can distribute a portion of climate modeling or machine learning to the plurality of node processing modules. In other embodiments, the cluster management module can monitor telemetries associated with the plurality of node processing modules. In some embodiments, the cluster management module can include a management logic. The management logic can be implemented on one or more FPGAs associated with the cluster management module. The management logic can perform various functions associated with the cluster management module. The cluster management module can be configured to obtain various telemetries associated with the plurality of node processing modules. These telemetries can include, for example, temperatures, voltages, currents of processing resources (e.g., CPUs, GPU, etc.) associated with the plurality of node processing modules. In some embodiments, the cluster management module can be configured to compare telemetries associated with the plurality of node processing modules to their baseline telemetries or compare telemetries between the plurality of node processing modules. Based on these comparisons, the cluster management module can predict impending faults or failures associated with the plurality of node processing modules. In some cases, the cluster management module can be configured to perform predictive failure analysis of the plurality of node processing modules. These and other features of the solutions are discussed herein.

FIG. 1 illustrates an example computing system 100 in accordance with various embodiments of the present disclosure. As discussed above, the computing system 100 can be configured to perform various complex computing tasks (i.e., computationally intense tasks) including modeling of various natural phenomena, for example. As shown in FIG. 1, in some embodiments, the computing system 100 can include a plurality of computing clusters 102a-102n. The plurality of computing clusters 102a-102n can be communicatively coupled to one another over a high-speed data bus or network. This configuration allows the computing system 100 to have a distributed computing architecture that enables the computing system 100 to distribute various computing tasks to the plurality of computing clusters 102a-102n. For example, the plurality of computing cluster 102a-102n can be coupled to one another over network or Ethernet. In this example, a large dataset and computing tasks needed to process the large dataset can be distributed, in approximately equal portions, to each of the plurality of computing clusters 102a-102n over the network or the Ethernet. In this way, the large dataset can be parallelly processed by the plurality of computing clusters 102a-102n and, thereby reducing time required to process such large datasets. The plurality of computing clusters 102a-102n will be discussed in greater detail with reference to FIG. 2 herein.

In some embodiments, the computing system 100 can further include a system management unit 104. In some embodiments, the system management unit 104 can include a thermal control unit. The thermal control unit can be configured to provide cooling to the plurality of computing clusters 102a-102n. For example, in some embodiments, the thermal control unit can provide cooling to the plurality of computing clusters 102a-102n by controlling a coolant flow to processors of the plurality of computing clusters 102a-102n. In some embodiments, the thermal control unit can monitor temperature and pressure of a coolant flow and control a speed of the coolant flow based on the temperature and the pressure. For example, an increase in temperature of a coolant flow may indicate an increase in thermal load associated with processors of a computing cluster. In this example, the thermal control unit may increase a speed at which the coolant flow is provided to the processors by increasing pressure of the coolant flow. This, in turn, causes cooling to the processors to increase. In some embodiments, the thermal control unit can read and store data associated with temperature and pressure of a coolant flow as telemetries. These telemetries can be later accessed and evaluated for predicting impending faults or failures associated with the plurality of computing clusters 102a-102n.

Figure 2:
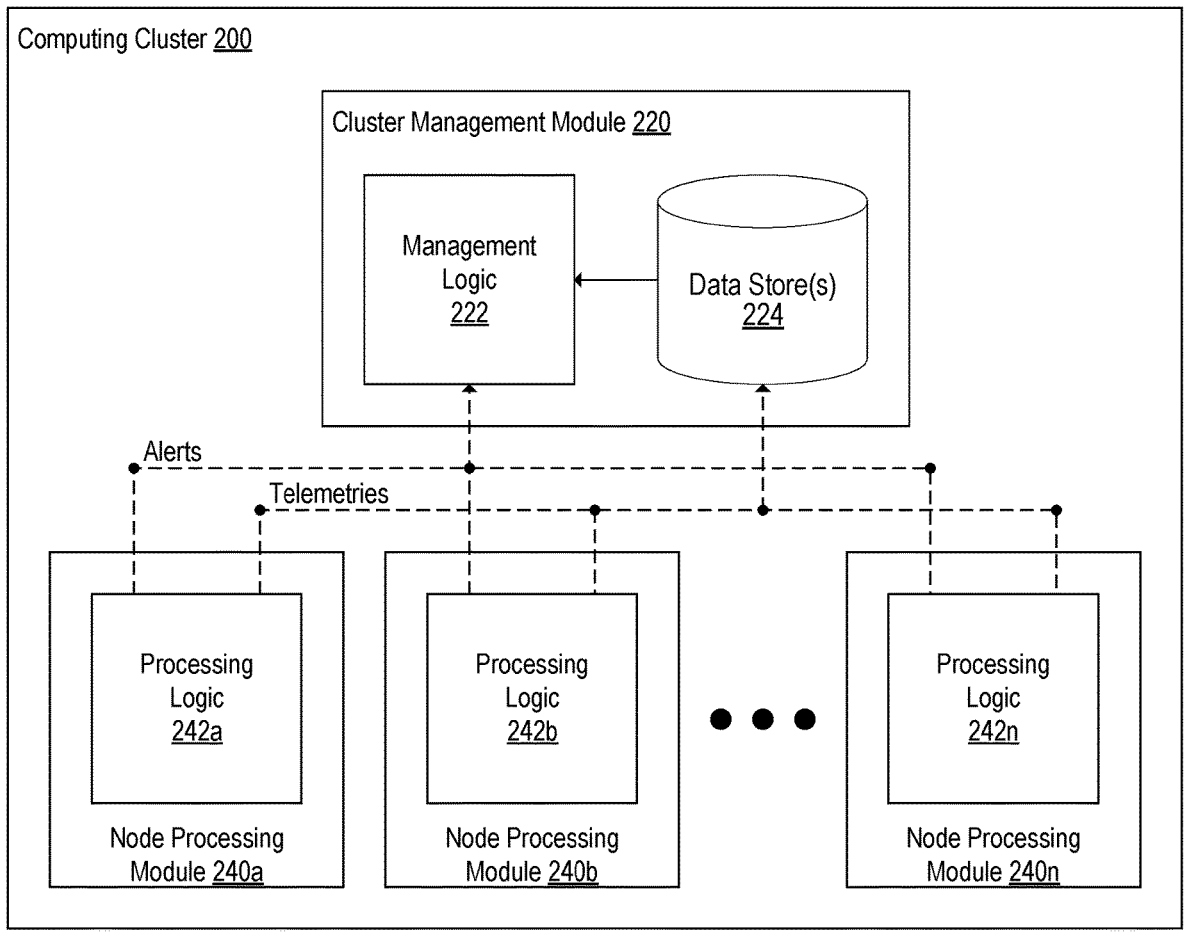
FIG. 2 illustrates an example computing cluster in accordance with various embodiments of the present disclosure.

FIG. 2 illustrates an example computing cluster 200 in accordance with various embodiments of the present disclosure. In some embodiments, the plurality of computing clusters 102a-102n of FIG. 1 can be implemented using the computing cluster 200. As discussed with respect to FIG. 1 above, the computing cluster 200 can perform a computing task assigned by a computing system (e.g., the computing system 100 of FIG. 1). As shown in FIG. 2, in some embodiments, the computing cluster 200 can include a cluster management module 220 and a plurality of node processing modules 240a-240n. The cluster management module 220 and the plurality of node processing modules 240a-240n will be discussed in further detail below.

In some embodiments, the cluster management module 220 can be configured to distribute computing tasks assigned to the computing cluster 200 to the plurality of node processing modules 240a-240n. For example, the cluster management module 220 can receive a dataset and a request to process the dataset from the computing system. In this example, the cluster management module 220 can distribute the dataset and associated computing tasks to process the dataset to the plurality of node processing modules 240a-240n. In some embodiments, the cluster management module 220 can be configured to access various telemetries associated with the plurality of node processing modules 240a-240n. For example, the cluster management module 220 can obtain temperature, voltage, and current telemetries associated with the plurality of node processing modules 240a-240n and provide the temperature, voltage, and current telemetries for display on a graphical user interface associated with the computing system. In general, telemetries are data streams that relate to monitoring health and status of hardware. For example, generally in a computing system, telemetries corresponding to voltages, currents, and temperatures associated with various electronic components can be monitored or telemetered. In some cases, telemetries corresponding to numbers of read/write cycles associated with memory components (e.g., a solid-state drives) and/or rotor speeds (e.g., revolution per minute) of fans can be monitored or telemetered. In some cases, various inputs/outputs or data interfaces or buses can be monitored or telemetered for errors or faults. Many variations are possible and contemplated.

In some embodiments, the plurality of node processing modules 240a-240n can be configured to perform or execute various computing tasks assigned to the plurality of node processing modules 240a-240n by the cluster management module 220. For example, the plurality of node processing modules 240a-240n can be configured to train a machine learning model as instructed by the cluster management module 220. As another example, the plurality of node processing modules 240a-240n can be configured to render a virtual environment of a virtual reality (VR) system as instructed by the cluster management module 220. Each node processing module of the plurality of node processing modules 240a-240n can include various electronic components responsible for executing a computing task. These electronic components can include, for example, one or more central processor units (CPUs), one or more graphical processor units (GPUs), one or more memory components, and one or more voltage regulators that regulate voltages and currents to the one or more CPUs, the one or more GPUs, and the one or more memory components. In some cases, each node processing module of the plurality of node processing modules 240a-240n can include fans and/or coolant flows to thermally cool the one or more CPUs/GPUs as the one or more CPUs/GPUs execute instructions needed to perform computing tasks. In some cases, each node processing module of the plurality of node processing modules 240a-240n can include temperature sensors that monitor temperatures associated with the one or more CPUs/GPUs and/or other electronic components.

In some embodiments, each node processing module of the plurality of node processing modules 240a-240n can further include a processing logic (e.g., processing logics 242a-242n). The processing logic can be implemented as whole or a part of one or more field-programmable gate arrays (FPGAs) associated with each node processing module. The processing logic can be configured or programmed to perform various functions associated with a node processing module. For example, the processing logic 242a can be configured or programmed to manage input/output (I/O) of the node processing module 240a. As another example, the processing logic 242b can be configured or programmed to buffer data to and from CPUs or GPUs of the node processing module 240b. In some embodiments, the processing logic can be configured or programmed to monitor telemetries associated with each node processing module.

For example, the processing logic 242a can be configured or programmed to monitor temperatures, voltages, and currents of CPUs or GPUs of the node processing module 240a. As another example, the processing logic 242b can be configured or programmed to monitor temperature, voltage, and current of a voltage regulator that regulates an input voltage to a CPU or GPU of the node processing module 240b. As yet another example, the processing logic 242n can be programmed to monitor a rotor speed of a fan that provides cooling to a CPU or GPU of the node processing module 240n. In some cases, the processing logic can be programmed to monitor errors on I/Os or data buses of a node processing module. For example, the processing logic 242a can be configured or programmed to monitor errors associated with a peripheral component interconnect express (PCIe) interface, a memory data interface, and/or other high-speed data or network interfaces of the node processing module 240a. In some embodiments, the processing logic can be programmed to post-process telemetries prior to transmitting the telemetries to the cluster management module 220 for display. In such embodiments, the processing logic can offload telemetry processing for the cluster management module 220. The processing logic will be discussed in further detail with reference to FIG. 3 herein.

Referring back to the cluster management module 220, in some embodiments, the cluster management module 220 can include a management logic 222 and at least one data store 224. The management logic 222 can be implemented as whole or a part of one or more field-programmable gate arrays (FPGAs) associated with the cluster management module 220. The management logic 222 can be configured or programmed to perform various functions associated with the cluster management module 220. For example, the management logic 222 can be configured or programmed to manage an input/output (I/O) of the cluster management module 220. As another example, the management logic 222 can be configured or programmed to buffer data transfer between data buses associated with the plurality of node processing modules 240a-240n.

In some embodiments, the management logic 222 can be configured or programmed to access telemetries associated with the plurality of node processing modules 240a-240n stored in the at least one data store 224. Based on the telemetries, the management logic 222 can predict impending faults or failures associated with the plurality of node processing modules 240a-240n. For example, the management logic 222 can access, from the at least one data store 224, a telemetry corresponding to a temperature of a CPU of the node processing module 240a. The management logic 222 can compare this temperature with a baseline temperature. In this example, if the management logic 222 determines that the temperature exceeds, or otherwise deviates from, the baseline temperature by a threshold value, the management logic 222 may flag or indicate the CPU as having an impending fault or failure. In this example, the management logic 222 may preemptively allocate computing tasks assigned to the node processing module 240a to other node processing modules autonomously without administrator intervention to mitigate the impending CPU failure. As another example, the management logic 222 can access, from the at least one data store 224, a telemetry corresponding to a voltage of a voltage regulator regulating an input voltage to a GPU of the node processing module 240b. The management logic 222 can compare this voltage with a baseline voltage. In this example, if the management logic 222 determines that the voltage exceeds or falls below the baseline voltage by a threshold value, the management logic 222 may flag or indicate the voltage regulator as having an impending fault or failure. In this example, the management logic 222 may preemptively allocate computing tasks assigned to the node processing module 240b to other processing modules autonomously without administrator intervention to mitigate the impending voltage regulator failure. In some cases, the management logic 222 can predict impending faults or failures by comparing telemetries between the plurality of node processing module 240a-240n. For example, a GPU of the node processing module 240a may be operating at a higher temperature than a corresponding GPU of the node processing module 240n under similar computing loads. In this example, the management logic 222 may flag or indicate the GPU of the node processing module 240a as having an impending failure. The management logic 222 will be discussed in further detail with reference to FIG. 4 herein.

In some embodiments, the management logic 222 can be configured or programmed to receive alerts from the plurality of node processing modules 240a-240n. For example, the processing logic 242n may detect an error on a PCIe interface of the node processing modules 240n. In this example, in response to detecting the error, the processing logic 242n may generate and transmit an alert to the management logic 222 indicating that an error had occurred on the PCIe interface. The management logic 222 can provide alerts received from the plurality of node processing modules 240a-240n for display on a user interface or graphical user interface.

In some embodiments, the at least one data store 224 can be configured to store telemetries associated with the plurality of node processing modules 240a-240n. For example, the processing logic 242a can monitor a rotor speed of a fan associated with the node processing module 240a. In this example, the processing logic 242a can store the rotor speed of the fan, as a telemetry, in the at least one data store 224. In some embodiments, the at least one data store can be store temperature and pressure of a coolant flow with which to cool the computing cluster 200 as telemetries. Various telemetries stored in the at least one data store 224 can be accessed by the management logic 222 to predict impending faults or failures associated with the plurality of node processing modules 240a-240n.

Figure 3:
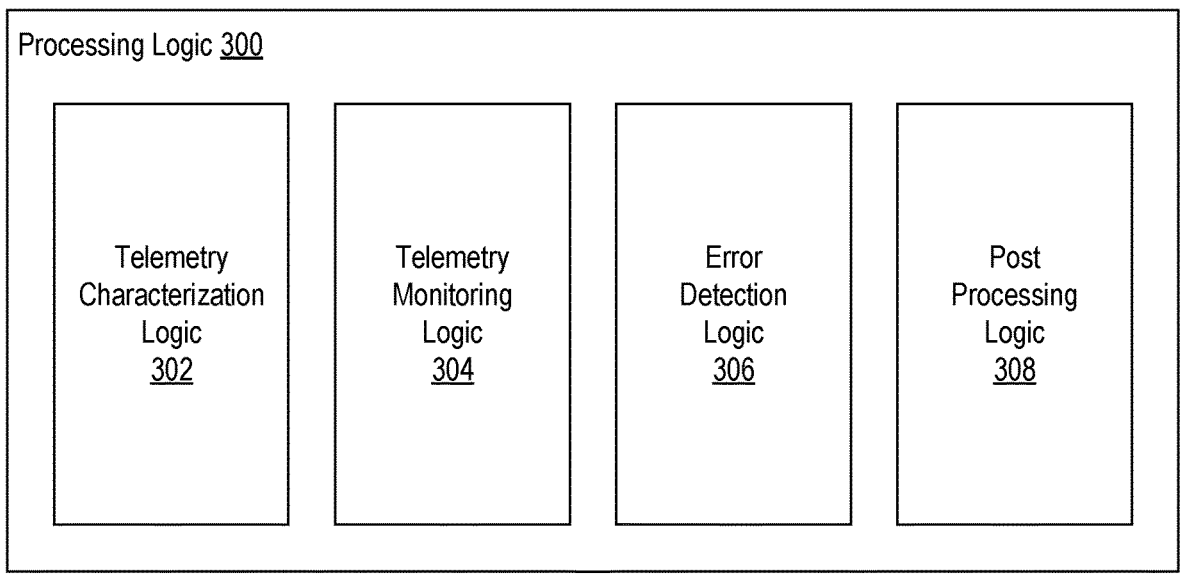
FIG. 3 illustrates an example processing logic in accordance with various embodiments of the present disclosure.

FIG. 3 illustrates an example processing logic 300 in accordance with various embodiments of the present disclosure. In some embodiments, the processing logics 242a-242n of FIG. 2 can be implemented using the processing logic 300. As discussed above, with reference to FIG. 2, the processing logic 300 can be implemented as whole or a part of one or more field-programmable gate arrays (FPGAs) associated with a node processing module (e.g., any of the plurality of node processing module 240a-240n of FIG. 2) of a computing cluster (e.g., the computing cluster 200 of FIG. 2) in which the processing logic 300 resides. In some embodiments, the processing logic 300 can be configured or programmed to autonomously monitor telemetries associated with the node processing module. These telemetries can include, for example, temperatures, voltages, and currents associated with CPUs/GPUs, memory components, and voltage regulators; rotor speed of fans; and/or temperature and pressure of coolant flows. In some embodiments, the processing logic 300 can be further configured or programmed to detect I/O errors associated with the node processing module. As shown in FIG. 3, in some embodiments, the processing logic 300 can include a telemetry characterization logic 302, a telemetry monitoring logic 304, an error detection logic 306, and a post processing logic 308. Each of these logics will be discussed in further detail herein.

In some embodiments, the telemetry characterization logic 302 can be configured or programmed to determine baseline telemetries of the node processing module. The baseline telemetries can be used by a management logic (e.g., the management logic 222 of FIG. 2) of a cluster management module (e.g., the cluster management module 220 of FIG. 2) of the computing cluster as bases of comparison. In some embodiments, the telemetry characterization logic 302 can determine baseline telemetries of the node processing module upon an initialization (i.e., bootup) of the node processing module. For example, the telemetry characterization logic 302 can monitor various telemetries corresponding to temperatures, voltages, and currents of a node processing module upon an initial bootup of the node processing module. These telemetries can be used by the management logic as bases of comparison for subsequent telemetries. For example, an input voltage to a GPU at initial bootup can be compared with an input voltage to the GPU after the GPU has been operating for some time to predict impending faults or failures. In some embodiments, the telemetry characterization logic 302 can baseline telemetries of the node processing module based on normal operating conditions. For example, the telemetry characterization logic 302 can monitor various telemetries corresponding to temperatures, voltages, and currents of a node processing module over a period of time. The telemetry characterization logic 302 can then average the temperatures, voltages, and currents over the period of time and use their averages as baseline telemetries for bases of comparison with subsequent telemetries. In some embodiments, the telemetry characterization logic 302 can baseline telemetries of a node processing module based on maximum thermal design power workloads associated with electronic components of the node processing module. For example, a CPU operating under a maximum thermal design power workload may be correlated to a particular temperature. This temperature can be used as a basis of comparison for subsequent temperature telemetries associated with the CPU. Once telemetries associated with a node processing module are baselined, the telemetry characterization logic 302 can store the baselined telemetries in a data store (e.g., the at least one data store 224 of FIG. 2) for later access to predict impending faults or failures of the node processing module.

In some embodiments, the telemetry monitoring logic 304 can be configured or programmed to autonomously monitor telemetries associated with the node processing module and stored the telemetries in the data store for later access. For example, the telemetry monitoring logic 304 can continuously monitor various temperature, voltage, and current telemetries of a node processing module while the processing module is executing computing tasks. These telemetries can be stored in the data store which can be used by the management logic to predict impending faults or failures of the node processing module. In general, a frequency (e.g., a rate) at which the telemetry monitoring logic 304 can monitor telemetries of a node processing module is limited only by lines speeds of interfaces through which the telemetries are monitored. For example, the telemetry monitoring logic 304 may be configured to monitor telemetries through an I2C interface and the I2C interface operates at a line speed of 1 MHz. In this example, the telemetry monitoring logic 304 can monitor (e.g., sample) the telemetries at a baud rate of 25 KHz. Whereas, if the telemetry monitoring logic 304 were to be implemented in software, the frequency at which the telemetry monitoring logic 304 can monitor the telemetries of the node processing module is limited by the software having to sequentially poll the telemetries at a frequency that is orders of magnitude less than the line speeds. Furthermore, in some cases, software implementations of the telemetry monitoring logic 304 can suffer from latencies. These latencies are associated with having to retrieve and process telemetry data from data packets from one bus to the next bus, serially. No such latencies exist for hardware implementations. Unlike software implementations, hardware implementations can parallelly process telemetry data from various buses. Therefore, hardware implementations of the telemetry monitoring logic 304 allow the telemetry monitoring logic 304 to operate at or near real-time while requiring only a minimal number of logic resources (e.g., a number of look up tables) to configure or program the telemetry monitoring logic 304 on a FPGA.

In some embodiments, the error detection logic 306 can be configured or programmed to autonomously monitor errors associated with I/Os or high-speed data buses or networks of the node processing module. For example, a graphics component (e.g., a graphics card) connected to a PCIe interface of the node processing module may throw an error. In this example, the error detection logic 306 may detect this error, and in response, generate an alert to the cluster management module. In some cases, the error detection logic 306 can monitor errors on various high-speed data buses. For example, data transmitted over a data bus between a CPU and a memory component can be error-coded. In this example, the error detection logic 306 can monitor for the data bus for any errors in the data transmitted between the CPU and the memory component. If an error is detected, the error detection logic 306, in response, can generate an alert to the cluster management module. Many variations are possible.

In some embodiments, the post processing logic 308 can be configured or programmed to post process telemetries before transmitting the telemetries to a cluster management module (e.g., the cluster management module 220 of FIG. 2) for further processing. In some embodiments, the post processing logic 308 can process and retrieve telemetry data from data packets associated with the telemetries. The post processing logic 308 can then repackage the telemetry data into different data packets for transmission to the cluster management module. In this way, the post processing logic 308 can offload a portion of telemetry processing from the cluster management module and to repackage the telemetry data for efficient processing by the cluster management module.

Figure 4:
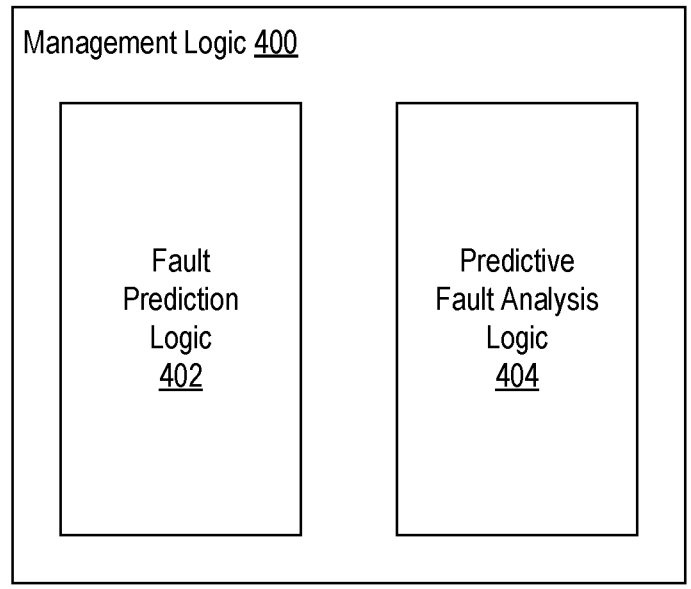
FIG. 4 illustrates an example management logic in accordance with various embodiments of the present disclosure.

FIG. 4 illustrates an example management logic 400 in accordance with various embodiments of the present disclosure. In some embodiments, the management logic 222 of FIG. 2 can be implemented as the management logic 400. As discussed above, with reference to FIG. 2, the management logic 400 can be implemented as whole or a part of one or more field-programmable gate arrays (FPGAs) associated with a cluster management module (e.g., the cluster management module 220 of FIG. 2) of a computing cluster (e.g., the computing cluster 200 of FIG. 2). As shown in FIG. 4, in some embodiments, the management logic 400 can include a fault prediction logic 402 and a predictive fault analysis logic 404. The fault prediction logic 402 and the fault analysis logic 404 will be discussed in further detail below.

In some embodiments, the fault prediction logic 402 can be configured or programmed to predict various impending faults or failures associated with a plurality of node processing modules (e.g., the plurality of node processing modules 240a-240n of FIG. 2) of the computing cluster. The fault prediction logic 402 can access telemetries corresponding to operating conditions and baselined telemetries associated with the plurality of node processing modules from a data store (e.g., the at least one data more 224 of FIG. 2). In some embodiments, the fault prediction logic 402 can predict impending faults or failures of the plurality of node processing modules by comparing the telemetries corresponding to the operating conditions to the baselined telemetries. For example, a baseline temperature of a CPU (or a GPU) can be based on a temperature corresponding to a maximum thermal design power workload associated with the CPU. In this example, if the CPU operates beyond the maximum thermal design power workload, the CPU can overheat and, in some cases, be throttled to operate at lower clock speeds. In some cases, the CPU can develop latent failures associated with transistors of the CPU that experience overheating. Therefore, in this example, as the fault prediction logic 402 continuously accesses and compares temperature telemetries of the CPU with the baselined temperature and if the temperature telemetries are trending toward the baseline temperature within a threshold value, the fault prediction logic 402 may determine or identify the CPU as potentially having an impending fault or failure. As another example, a baseline temperature of a memory component can correspond to a temperature range associated with the memory component operating under normal conditions. In this example, as the fault prediction logic 402 continuously accesses and compares temperature telemetries corresponding to the memory component with the baselined temperature range and if the temperature telemetries are trending outside the baselined temperature range within a threshold value, the fault prediction logic 402 may determine or identify the memory component as potentially having an impending fault or failure. In some embodiments, the fault prediction logic 402 can predict impending faults or failures of the plurality of node processing modules by determining relative telemetry changes to historical operating conditions. For example, a CPU of a node processing module historically operates at an input voltage of 5 V. In this example, if the fault prediction logic 402 determines that the input voltage exceeds or falls below 5 V, the fault prediction logic 402 may determine or identify an impending fault or failure for the CPU. Many variations are possible and contemplated. For example, in some embodiments, the fault prediction logic 402 can monitor operating conditions of a node processing module and compare the operating conditions of the node processing module with operating conditions of other node processing modules to predict impending faults or failures. For example, GPU temperatures of different node processing modules can be compared against one another to determine any abnormal temperature profiles. Based on these temperature profiles, the fault prediction logic 402 can predict impending GPU faults or failures.

In some embodiments, the predictive fault analysis logic 404 can be configured or programmed to perform predictive failure analysis for various electronic components of the node processing module based on telemetries associated with the electronic components. The predictive fault analysis logic 404 can perform predictive failure analysis by correlating a telemetry with other telemetries. For example, the predictive fault analysis logic 404 can perform predictive failure analysis on a voltage regulator by correlating a temperature telemetry with voltage and current telemetries of the voltage regulator. In this example, if the temperature telemetry no longer correlates with the voltage and current telemetries, the predictive fault analysis logic 404 may indicate an impending fault or failure for the voltage regulator. As another example, a telemetry corresponding to a rotor speed of a fan may be correlated with a temperature telemetry of a node processing module. In this example, if the rotor speed no longer correlates with temperature of the node processing module, the predictive fault analysis logic 404 may indicate an impending fault or failure for the fan. In some embodiments, the predictive fault analysis logic 404 can correlate telemetries of the node processing module with telemetries from a thermal control unit (e.g., the thermal control unit 104 of FIG. 1). For example, the predictive fault analysis logic 404 can correlate temperature telemetries of a CPU or GPU with a coolant flow provided by the thermal control unit.

Figure 5:
FIG. 5 illustrates a computing component that includes one or more programmable hardware processors that, when operated, cause the computing component to perform an illustrative method for performing predictive fault detection and analysis in accordance with various embodiments of the present disclosure.

FIG. 5 illustrates a computing component 500 that includes one or more programmable hardware processors 502 that, when operated, cause the computing component 500 to perform an illustrative method for performing predictive fault detection and analysis in accordance with various embodiments of the present disclosure. The computing component 500 may be, for example, the computing system 600 of FIG. 6. The programmable hardware processors 502 may include, for example, the processor(s) 604 of FIG. 6 or any other processing unit described herein.

At block 504, a first logic component (e.g., the processing logic 300 of FIG. 3) can baseline a plurality of telemetries associated with a processing node (e.g., any of the plurality of node processing modules 240a-240n of FIG. 2) of a computing cluster (e.g., the computing cluster 200 of FIG. 2). In some embodiments, the plurality of telemetries associated with the processing node can include temperatures, voltages, and currents of processing resources associated with the processing node. The processing resources can include at least one of a central processor unit, a graphical processor unit, a memory component, or a voltage regulator. In some embodiments, the plurality of telemetries associated with the processing node can further include a rotor speed of a fan and a temperature and a pressure of a coolant flow associated with the processing node.

At block 506, the first logic component can monitor the plurality of telemetries while the processing node is in operation. In some embodiments, the first logic component can be implemented on a field-programmable gate array associated with the node processing module.

At block 508, a second logic component (e.g., the management logic 400 of FIG. 4) can compare the monitored plurality of telemetries with the baselined plurality of telemetries. In some embodiments, the second logic component can be implemented on a field-programmable gate array different than the field-programmable gate array associated with the processing node.

At block 510, the second logic component can predict one or more impending faults associated with the processing node based on the comparisons. In some embodiments, the second logic component can predict the one or more impending faults associated with the processing node by determining that a monitored telemetry is trending toward a corresponding baselined telemetry within a threshold value. The second logic component can determine a processing resource (e.g., a CPU, a GPU, a memory component, a voltage regulator, etc.) that is associated with the monitored telemetry and identify at least one impending fault associated with the processing resource. In some embodiments, the second logic component can predict the one or more impending faults associated with the processing node by determining that a monitored telemetry is trending outside a range of a corresponding baselined telemetry within a threshold value. The second logic component can determine a processing resource (e.g., a CPU, a GPU, a memory component, a voltage regulator, etc.) that is associated with the monitored telemetry and identify at least one impending fault associated with the processing resource.

Figure 6:
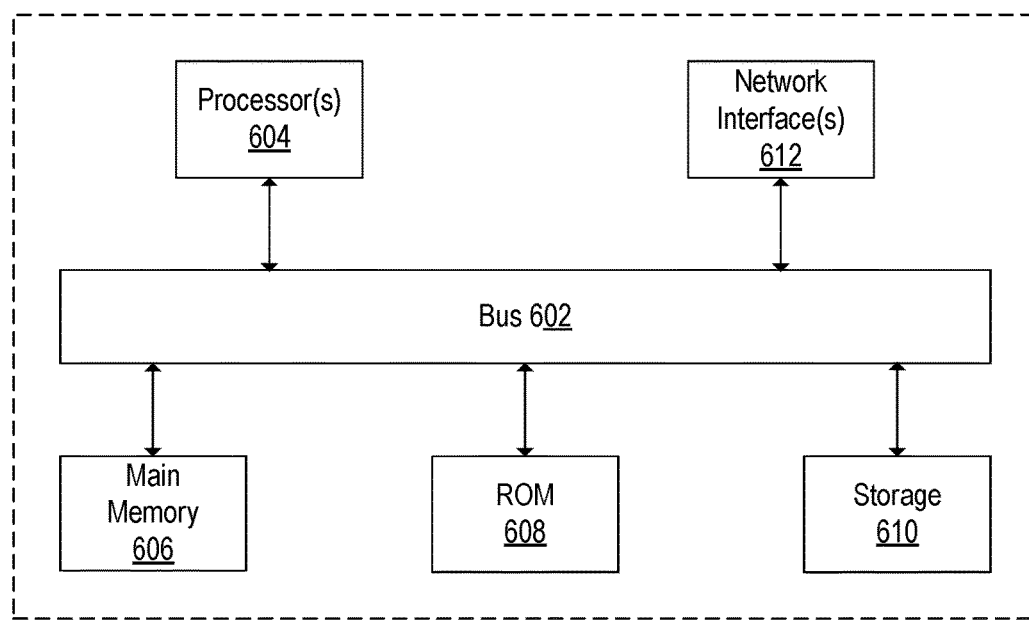
FIG. 6 illustrates a block diagram of an example computer system in which various embodiments of the present disclosure may be implemented.

FIG. 6 illustrates a block diagram of an example computer system 600 in which various embodiments of the present disclosure may be implemented. The computer system 600 can include a bus 602 or other communication mechanism for communicating information, one or more hardware processors 604 coupled with the bus 602 for processing information. The hardware processor(s) 604 may be, for example, one or more general purpose microprocessors. The computer system 600 may be an embodiment of an access point controller module, access point, or similar device.

The computer system 600 can also include a main memory 606, such as a random access memory (RAM), cache and/or other dynamic storage devices, coupled to the bus 602 for storing information and instructions to be executed by the hardware processor(s) 604. The main memory 606 may also be used for storing temporary variables or other intermediate information during execution of instructions by the hardware processor(s) 604. Such instructions, when stored in a storage media accessible to the hardware processor(s) 604, render the computer system 600 into a special-purpose machine that can be customized to perform the operations specified in the instructions.

The computer system 600 can further include a read only memory (ROM) 608 or other static storage device coupled to the bus 602 for storing static information and instructions for the hardware processor(s) 604. A storage device 610, such as a magnetic disk, optical disk, or USB thumb drive (Flash drive), etc., can be provided and coupled to the bus 602 for storing information and instructions.

Computer system 600 can further include at least one network interface 612, such as a network interface controller module (NIC), network adapter, or the like, or a combination thereof, coupled to the bus 602 for connecting the computer system 600 to at least one network.

In general, the word "component," "modules," "engine," "system," "database," and the like, as used herein, can refer to logic embodied in hardware or firmware, or to a collection of software instructions, possibly having entry and exit points, written in a programming language, such as, for example, Verilog, VHDL, Java, C or C++. A software component or module may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices, such as the computing system 600, may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of an executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 600 may implement the techniques or technology described herein using customized hard-wired logic, one or more ASICs or FPGAs, firmware and/or program logic which in combination with the computer system 600 that causes or programs the computer system 600 to be a special-purpose machine. According to one or more embodiments, the techniques described herein are performed by the computer system 600 in response to the hardware processor(s) 604 executing one or more sequences of one or more instructions contained in the main memory 606. Such instructions may be read into the main memory 606 from another storage medium, such as the storage device 610. Execution of the sequences of instructions contained in the main memory 606 can cause the hardware processor(s) 604 to perform process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. The non-volatile media can include, for example, optical or magnetic disks, such as the storage device 610. The volatile media can include dynamic memory, such as the main memory 606. Common forms of the non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

The non-transitory media is distinct from but may be used in conjunction with transmission media. The transmission media can participate in transferring information between the non-transitory media. For example, the transmission media can include coaxial cables, copper wire and fiber optics, including the wires that comprise the bus 602. The transmission media can also take a form of acoustic or light waves, such as those generated during radio-wave and infra-red data communications.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A computer-implemented method for hardware-based predictive fault detection and analysis, the method comprising:
   monitoring, during operation of a first processing node, a first plurality of telemetries for the first processing node;
   monitoring, during operation of a second processing node, a second plurality of telemetries for the second processing node, the second plurality of telemetries corresponding to the first plurality of telemetries;
   comparing a first telemetry of the first plurality of telemetries for a first processing resource associated with the first processing node with a first telemetry of the second plurality of telemetries for a first processing resource associated with the second processing node, the first telemetry of the first plurality of telemetries and the first telemetry of the second plurality of telemetries being a telemetry of a same telemetry type and the first processing resource of the first processing node and the first processing resource of the second processing node being a processing resource of a same processing resource type;
   comparing the first telemetry of the first plurality of telemetries for the first processing resource associated with the first processing node with a baseline value for the first telemetry of the first plurality of telemetries;
   predicting a first impending fault associated with the first processing node in response to the first telemetry of the first plurality of telemetries for the first processing resource associated with the first processing node deviating from the first telemetry of the second plurality of telemetries for the first processing resource associated with the second processing node and in response to the first telemetry of the first plurality of telemetries deviating from the baseline value by a threshold value for the first telemetry of the first plurality of telemetries; and
   reallocating, in response to predicting the first impending fault associated with the first processing node, computing tasks assigned to the first processing node to another processing node, causing the another processing node to which the computing tasks are reallocated to perform the computing tasks that are reallocated to the another processing node.

2. The computer-implemented method of claim 1, wherein the first plurality of telemetries and the second plurality of telemetries each comprise one or more of:
   temperatures, voltages, and currents of processing resources; or
   attributes of a coolant flow.

3. The computer-implemented method of claim 1, further comprising:
   monitoring operating conditions of the first processing node and the second processing node; and
   comparing the operating conditions of the first processing node with operating conditions of the second processing node to predict a third impending fault.

4. The computer-implemented method of claim 1, wherein predicting the first impending fault comprises:
   determining the first processing resource that is associated with the first processing node; and
   identifying the first impending fault associated with the first processing resource related to the first telemetry of the first plurality of telemetries.

5. The computer-implemented method of claim 1, further comprising:
   providing the first impending fault for display on a user interface.

6. The computer-implemented method of claim 1, wherein:
   monitoring the first plurality of telemetries for the first processing node and monitoring the second plurality of telemetries for the second processing node are performed by processing logic components; and
   comparing the first plurality of telemetries for the first processing node with the second plurality of telemetries for the second processing node and the reallocating the computing tasks assigned to the first processing node to the another processing node are performed by management logic components.

7. The computer-implemented method of claim 6, wherein the processing logic components and the management logic components are implemented on field-programmable gate arrays associated with the first processing nodes.

8. The computer-implemented method of claim 1, further comprising:
   comparing a second telemetry of the first plurality of telemetries with baseline values for the first plurality of telemetries;
   predicting a second impending fault associated with the first processing node in response to the second telemetry of the first plurality of telemetries trending outside a range of the baseline values for the second telemetry of the first plurality of telemetries; and
   reallocating, in response to predicting the second impending fault associated with the first processing node, computing tasks assigned to the first processing node to another processing node.

9. The computer-implemented method of claim 8, wherein predicting the second impending fault comprises:
   determining a second processing resource that is associated with the first processing node; and
   identifying the second impending fault associated with the second processing resource related to the second telemetry of the first plurality of telemetries.

10. The computer-implemented method of claim 8, wherein the baseline values for the first plurality of telemetries is determined upon an initial bootup of the first processing node.

11. The computer-implemented method of claim 8, wherein the baseline values for the first plurality of telemetries comprises an average value of the first plurality of telemetries under normal operation over a period of time.

12. The computer-implemented method of claim 8, wherein the baseline values for the first plurality of telemetries comprises a value of the first plurality of telemetries corresponding to the first processing node operating under a maximum thermal design power workload.

13. A system, comprising:
   one or more processors; and
   a non-transitory computer-readable medium storing programming for execution by the one or more processors, the programming comprising instructions to:
      distribute computing tasks assigned to a first node processing module of a first computing cluster and a second node processing module of a second computing cluster, the first computing cluster and the second computing cluster being a same or different computing clusters;

monitor a first plurality of telemetries of the first node processing module and a second plurality of telemetries of the second node processing module, the second plurality of telemetries corresponding to the first plurality of telemetries;

determine baseline values for the first plurality of telemetries of the first node processing module;

compare a first telemetry of the first plurality of telemetries for a first processing resource associated with the first node processing module and a first telemetry of the second plurality of telemetries for a first processing resource associated with the second node processing module, the first telemetry of the first plurality of telemetries and the first telemetry of the second plurality of telemetries being a telemetry of a same telemetry type and the first processing resource of the first processing node module and the first processing resource of the second processing node module being a processing resource of a same processing resource type;

compare the first plurality of telemetries of the first node processing module with the baseline values of the first plurality of telemetries of the first node processing module;

predict a first impending fault associated with the first node processing module in response to the first telemetry of the first plurality of telemetries of the first node processing module deviating from the first telemetry of the second plurality of telemetries of the second node processing module;

predict a second impending fault associated with the first node processing module in response to the first plurality of telemetries for the first node processing module being outside of a range of the baseline values of the first plurality of telemetries; and re-distribute the computing tasks assigned to the first node processing module to one or more other node processing modules in response to the first impending fault or the second impending fault being predicted, causing the one or more other node processing modules to which the computing tasks are re-distributed to perform the computing tasks that are re-distributed to the one or more other node processing modules.

14. The system of claim 13, wherein the first plurality of telemetries and the second plurality of telemetries each comprise one or more of:
   temperatures, voltages, and currents of processing resources; or
   attributes of a coolant flow.

15. The system of claim 14, further comprising:
   a thermal control unit configured to provide cooling to the first computing cluster and the second computing cluster by monitoring the attributes of the coolant flow and controlling attributes of the coolant flow based on the attributes of the coolant flow.

16. The system of claim 15, wherein the thermal control unit is configured to read and store data associated with the attributes of the coolant flow.

17. A computer-implemented method for hardware-based predictive fault detection and analysis, the method comprising:
   monitoring a first plurality of telemetries of a first node processing module and a second plurality of telemetries of a second node processing module, the first node processing module associated with a first computing cluster and the second node processing module associated with a second computing cluster, the first computing cluster and the second computing cluster being a same or different computing clusters;

comparing a first telemetry of the first plurality of telemetries for a first processing resource associated with the first node processing module and a first telemetry of the second plurality of telemetries for a first processing resource associated with the second node processing module, the second plurality of telemetries corresponding to the first plurality of telemetries, the first processing resource of the first processing node module and the first processing resource of the second processing node module being a processing resource of a same processing resource type;

comparing the first telemetry of the first plurality of telemetries for the first processing resource associated with the first node processing module with a baseline value for the first telemetry of the first plurality of telemetries;

predicting a first impending fault associated with the first node processing module in response to the first telemetry of the first node processing module deviating from the first telemetry of the second plurality of telemetries of the second node processing module and in response to the first telemetry of the first node processing module deviating from the baseline value for the first telemetry of the first plurality of telemetries; and re-distributing, in response to predicting the first impending fault, computing tasks assigned to the first node processing module to another node processing module, causing the another node processing modules to which the computing tasks are re-distributed to perform the computing tasks that are re-distributed to the another node processing modules.

18. The computer-implemented method of claim 17, further comprising:
   comparing the first plurality of telemetries of the first node processing module with baseline values for the first plurality of telemetries of the first node processing module;
   predicting a second impending fault associated with the first node processing module in response to the first plurality of telemetries for the first node processing module being outside of a range of the baseline values for the first plurality of telemetries; and
   re-distributing, in response to predicting the second impending fault, computing tasks assigned to the first node processing module to the another node processing module.

19. The computer-implemented method of claim 17, wherein the first plurality of telemetries and the second plurality of telemetries each comprise one or more of:
   temperatures, voltages, and currents of processing resources; or
   attributes of a coolant flow.

20. The computer-implemented method of claim 19, further comprising:
   controlling the attributes of the coolant flow associated with the first computing cluster to thermally cool processing resources, wherein the processing resources include at least one of a central processor unit, a graphical processor unit, or a memory component.

* * * * *